United States Patent [19]

Kolcio et al.

[11] Patent Number: 4,583,039

[45] Date of Patent: Apr. 15, 1986

[54] ELECTRICAL TESTING DEVICE FOR INSULATING GLOVES

[76] Inventors: Nestor Kolcio, 11500 Jerome Rd., Plain City, Ohio 43064; Richard A. Peszlen, 5675 Lindenwood Rd., Columbus, Ohio 43229

[21] Appl. No.: 620,612

[22] Filed: Jun. 14, 1984

[51] Int. Cl.⁴ ............................................. G01R 31/12
[52] U.S. Cl. ...................................................... 324/54
[58] Field of Search .................. 324/54; 73/41.2, 41.3, 73/41.4, 45.5, 52, 53

[56] References Cited

U.S. PATENT DOCUMENTS 3,414,808  12/1968  Thomas ................................. 324/54

*Primary Examiner*—Stanley T. Krawczewicz
*Attorney, Agent, or Firm*—Michael Sand Co.

[57] ABSTRACT

A device for immersing and electrically testing an insulating glove in a conductive liquid to determine if the glove is safe for electrical work. The glove is suspended beneath a platform by a pair of insulating barrier rings which clamp the glove cuff therebetween. A hollow electrode extends into the interior of the glove and is connected to a source of water for filling the glove with water. An air sensing tube surrounds the electrode and forms an air passage therebetween and is connected to an air blower and air pressure switch for detecting and deactivating the flow of water into the glove upon it reaching a predetermined level. The inner barrier ring is mounted on a manually movable tube which is telescopically mounted about the air sensing tube and electrode. The platform is movably mounted by an elevator mechanism for immersing the glove in the conductive liquid. The barrier rings reduce the electric field stress and eliminate corona effects on the glove cuff. The glove mounting and filling arrangement eliminates exposed metal parts and reduces accidental flashover by increasing the distance that the electric discharge arc must travel to flashover.

16 Claims, 4 Drawing Figures

ELECTRICAL TESTING DEVICE FOR INSULATING GLOVES

TECHNICAL FIELD

The invention relates to devices for testing insulating gloves such as those used in the electrical industry for live line maintenance work. More particularly, the invention relates to such an electrical glove testing device which eliminates the corona effect on the glove cuffs, and which enables essentially the whole glove to be tested satisfactorily in an efficient and safe manner.

BACKGROUND ART

An example of this application is the electrical testing of insulating gloves of the type used by electricians and utility linemen for performing live line maintenance has been carried out for many years in an effort to detect holes or flaws in the glove to ensure that the same are safe to prevent electrical shock injury to the workmen. One of the usual procedures for testing such gloves is to partially immerse the glove in a tank of conductive liquid, usually water. An electrode is inserted into the glove which is filled with a conductive liquid to the same level as in the tank. During the test the tank containing the conductive liquid is at another electrical potential with respect to the glove electrode. The potential difference (an electrical stress) will cause a breakdown in the glove at the damaged area. This breakdown will actuate a signal or will be visible or audible to the workman performing the glove testing procedure.

Although such test procedures usually are satisfactory for many glove tests, it has the disadvantage of placing electrical stresses at the junction of the water surface and cuff of the glove. These stresses at the water surface will reach a level whereby the surrounding air is ionized resulting in the production of ozone and corona. Ozone is very destructive to insulating gloves made of natural rubber. This high stress placed at the cuff area results in excessive glove failure during tests. These existing tests also require the use of gloves having excessively long cuff areas to enable the glove to be tested. This excessive length cuff on the glove, in addition to increasing the cost of the glove, makes the gloves more burdensome and awkward for the workmen wearing the gloves.

Another problem with prior glove testing devices is that the electrode which is inserted into the interior of an immersed glove is exposed together with other metal parts on the test equipment. This exposure provides a relatively short discharge path across which an electric arc can travel shorting out the equipment and in some circumstances may cause possible injury to a workman performing the glove test.

Another disadvantage of the prior glove test equipment is the difficulty in testing gloves at different potential where cuff length would have to be adjusted.

DISCLOSURE OF THE INVENTION

Objectives of the invention include providing an improved electrical glove testing device in which the gloves are mounted by a pair of specially shaped insulating barrier rings which reduce electrical stresses and eliminate corona effect and subsequent generation of harmful ozone which damages gloves made of natural rubber; and in which the mounting rings enable almost the whole glove to be satisfactorily and efficiently tested than heretofore possible. Another objective is to provide such a testing device in which the insulated barrier rings enable the glove to be placed on and removed from the test equipment in a shorter period of time by manipulation of a single clamping lever.

Still another objective of the invention is to provide such a testing device in which the test electrode that is inserted into the glove interior also functions as a liquid fill tube for filling the glove interior with a conductive liquid thereby facilitating its immersion into the conductive liquid; in which an air tube is telescopically mounted about the electrode and forms an air passage therebetween; and in which this air passage is connected to an air supply source and an air pressure switch which automatically senses when the conductive liquid which is fed into the glove interior through the electrode reaches a predetermined level and automatically shuts off the liquid supply. The mechanism for lowering the filled glove into the testing tank is activated during the filling process.

A still further objective is to provide such a testing device in which a plurality of gloves may be mounted on a single platform which is raised and lowered with respect to the test tank by an elevator mechanism controlled by endless chains, pneumatic or hydraulic cylinders or the like. Another objective is to provide such a testing device in which the inner glove holding ring is moved into and out of clamping position with the glove cuff by a sleeve formed of insulating material which is telescopically mounted about the air sensing tube and electrode; and in which this glove clamping sleeve provides insulation for the exposed metal of the air sensing tube and electrode thereby increasing the discharge path between the adjacent conductive liquid and exposed metal parts to prevent premature arcing during a test operation.

A still further objective of the invention is to provide such a testing device which enables a plurality of gloves to be tested satisfactorily in a relatively short period of time without damaging the gloves; which device is relatively inexpensive in construction and operation; and which achieves the stated objectives simply and effectively, solves problems and satisfies needs existing in the art.

These objectives and advantages are obtained by the improved electrical glove testing device of the invention, the general nature of which may be stated as including a platform; tank means located beneath the platform for holding a supply of conductive liquid; elevator means for raising and lowering the platform with respect to the tank means; glove mounting means for releasably suspending a glove to be tested from the platform; electrode means for insertion into the interior of a glove when suspended from the platform by the glove mounting means; means for filling a suspended glove with a conductive liquid; air sensing means for detecting when the glove has been filled with the conductive liquid to a predetermined level; and control means communicating with the air sensing means for automatically stopping the flow of liquid into the glove upon the liquid in said glove reaching a predetermined level.

BRIEF DESCRIPTION OF THE DRAWINGS

A preferred embodiment of the invention, illustrative of the best mode in which applicants have contemplated applying the principles, is set forth in the following description and is shown in the drawings and is particularly and distinctly pointed out and set forth in the appended claims.

Similar numerals refer to similar parts throughout the drawings.

BEST MODE FOR CARRYING OUT THE INVENTION

Figure 1:
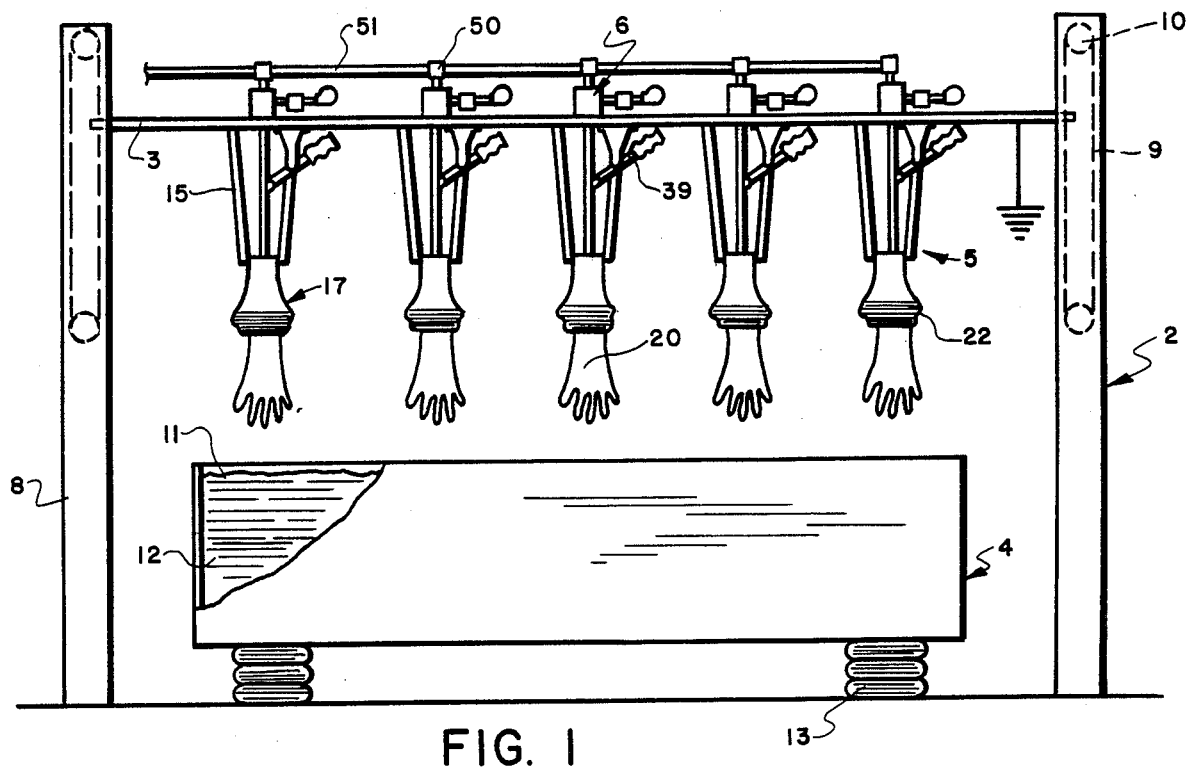
FIG. 1 is a diagrammatic elevational view of a plurality of insulating gloves mounted on a platform which is movably mounted on an elevator above a conductive liquid test tank.

The improved electrical testing device for insulating gloves is indicated generally at 1, and is shown particularly in FIG. 1. Device 1 includes as main components a supporting elevator structure indicated generally at 2, a platform 3, a conductive liquid supply tank 4, a glove mounting assembly 5 and a water fill control assembly 6. Elevator 2 may have various configurations and arrangements other than the one shown in FIG. 1 which consists of a pair of vertical end supports 8 having an endless chain 9 extending about upper and lower power driven sprockets 10. Elevator 2 could consist of a hydraulic or pneumatic piston arrangement for raising and lowering platform 3 without affecting the concept of the invention. Platform 3 is a rigid support on which one or more glove mounting assemblies 5 are suspended from the undersurface thereof. Platform 3 and water fill control assembly 6 are at the same potential and electrically grounded.

Tank 4 is of a special construction capable of reducing electrical stresses in the liquid and device 1 having an open top 11 and filled with a conductive liquid 12 which usually will be water. The tank is supported by insulators 13 capable of withstanding the maximum test voltage.

Figure 2:
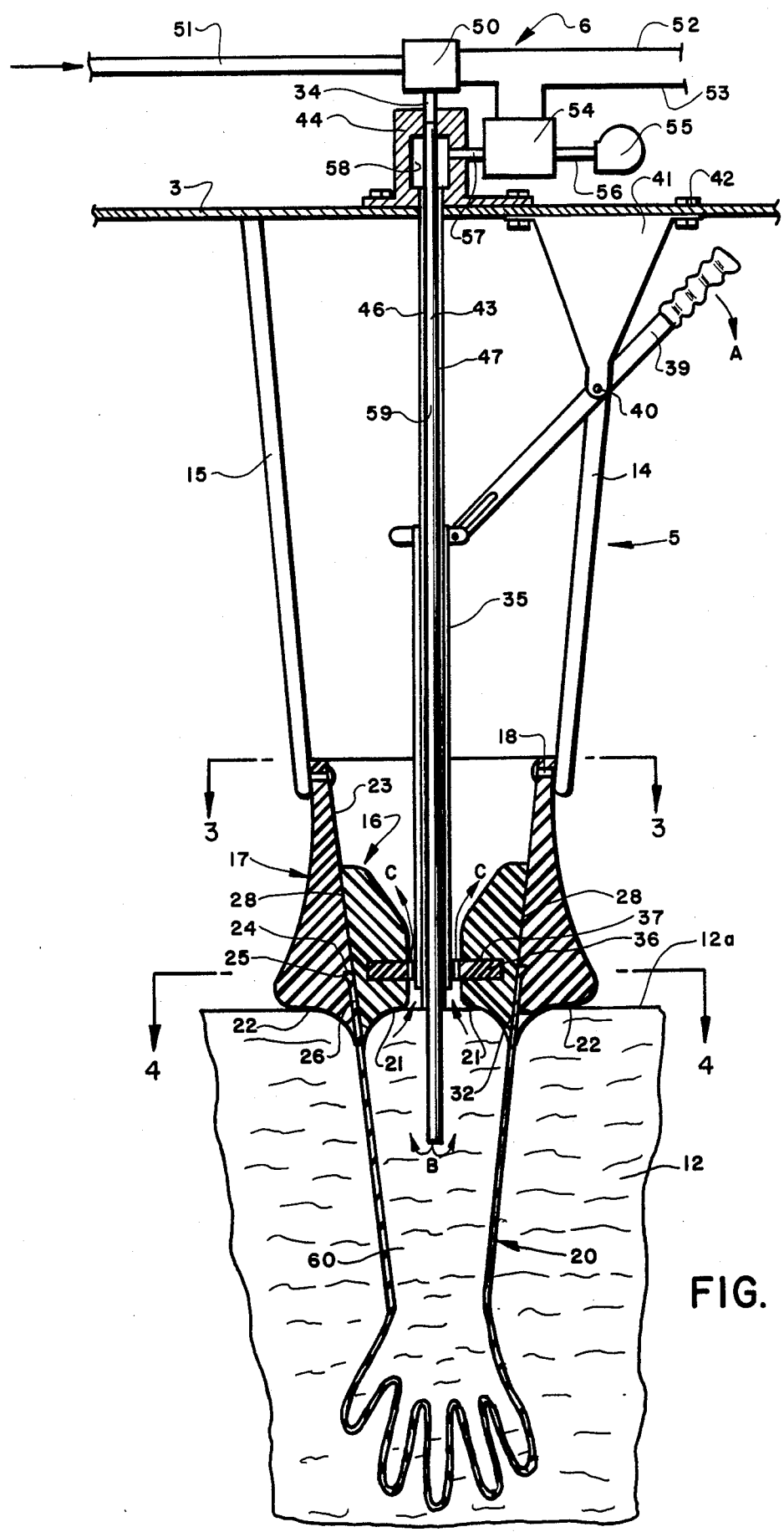
FIG. 2 is an enlarged longitudinal diagrammatic sectional view showing a glove mounted on the glove mounting assembly of the improved testing device.

Improved glove mounting assembly 5 which is shown particularly in FIG. 2 is the main feature which enables the desired features and advantages of the invention to be achieved. Assembly 5 includes a pair of brackets 14 and 15 which are connected to the underside surface of platform 3 and extend downwardly therefrom. Brackets 14 and 15 preferably are formed of a relatively rigid dielectric material free of any metal parts which would provide a possible arcing point during the testing of gloves.

Assembly 5 includes inner and outer annular rings 16 and 17 formed of an insulating material. Outer ring 17 is mounted on the lower ends of brackets 14 and 15 by dielectric pins 18. An insulating glove 20 of the type to be tested by device 1 is shown in FIG. 2 clamped between inner and outer rings 16 and 17 and immersed in a conductive liquid 12. Inner and outer insulating rings 16 and 17 each have an annular configuration and are formed with gradually smooth curved bottom surfaces 21 and 22 respectively, for merging with top surface 12a of conductive liquid 12. These smooth surfaces provide a gradual curve to the water surface around the areas where the water comes in contact with the inner and outer insulating ring surfaces 21 and 22. Here, the electric field intensity is reduced around these areas and the resulting electrical stress is minimized.

Outer ring 17 has a smooth tapered inner surface 23 formed with an annular groove 24 for receiving the outer bead edge 25 of insulating glove cuff 26. Surface 23 of outer ring 17 is adapted to slidably engage a complementary-shaped smooth tapered surface 28 of inner ring 16 to clamp cuff 26 therebetween as shown in FIG. 2. Bottom surfaces 21 and 22 of rings 16 and 17 have smooth curved surface portions which are adapted to lie generally along top surface 12a of conductive liquid 12. Surface 22 of outer ring 17 merges with a flat recessed portion 32 which is formed in tapered surface 23 below groove 24 for receiving glove cuff 26 therein when secured by inner ring 16.

Curved bottom surface 21 of inner ring 16 merges with outer tapered surface 28. These curved surfaces will eliminate sharp cornered edges or meiscus at the junction of the conductive liquid surface 12a and the insulating dielectric.

Inner ring 16 is movably mounted by an insulating sleeve 35 which is connected to the ring by a perforated disc 36. Disc 36 is mounted in an annular cutout 37 formed in inner ring 16 and is provided with a plurality of holes 38. Sleeve 35 is formed of a rigid insulating material such as nylon or plastic and is connected at its upper end by a slot-pin connection to a lever 39. Lever 39 is pivotally mounted by a pin 40 to bracket 14 and a triangular-shaped bracket section 41 which is mounted by bolts 42 on platform 3.

Figure 3:
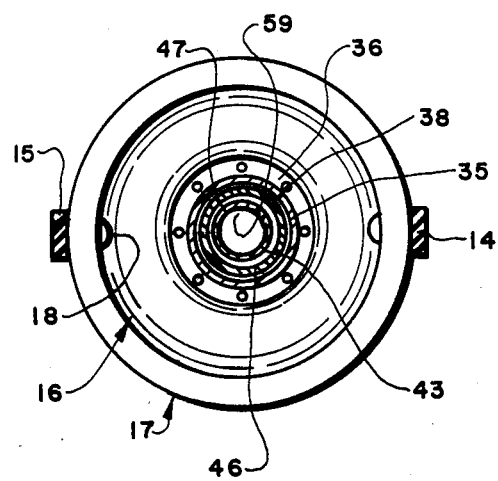
FIG. 3 is an enlarged sectional view taken on line 3—3, FIG. 2.
Figure 4:
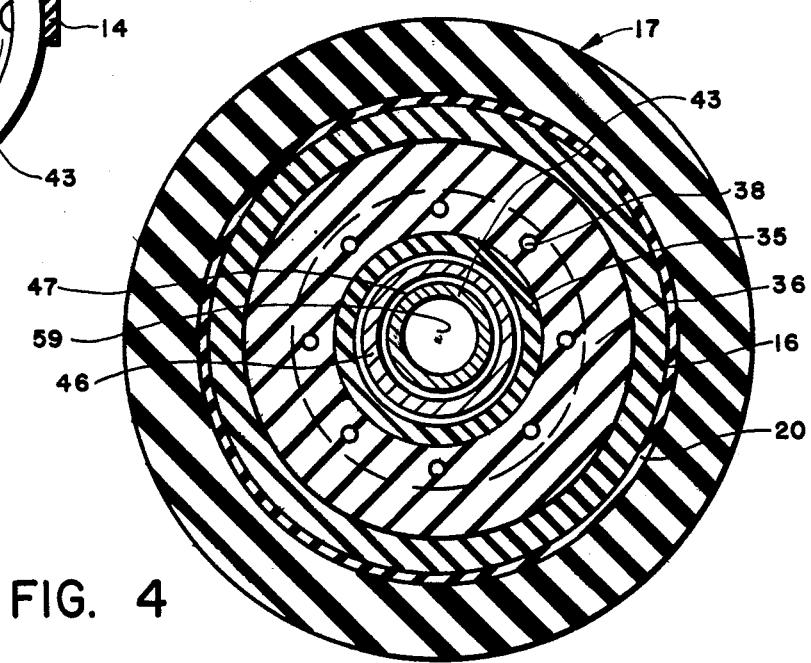
FIG. 4 is a greatly enlarged sectional view taken on line 4—4, FIG. 2.

In accordance with another feature of the invention, a hollow tubular metal electrode 43 is mounted at its upper end to platform 3 by a metal block 44. An air sensing tube 46 is telescopically mounted about electrode 43 and is located within insulating sleeve 35. Air tube 46 is spaced a sufficient distance from electrode 43 to provide an annular air passage 47 therebetween, shown particularly in FIGS. 3 and 4. An electrically controlled liquid control valve 50 is connected to the upper end of electrode 43 by conduit 34 and to an incoming water line 51 which is connected to a usual water supply.

Valve 50 is connected by a pair of electric lines 52 and 53 to a usual source of electrical power. An air pressure switch 54 is connected in electric line 53 and controlled thereby and is connected to an air blower 55 by a conduit 56. A second conduit 57 connects air pressure switch 54 with the hollow interior 58 of insulating block 44. Annular air passage 47 which is formed between electrode 43 and air sensing tube 46 also communicates with interior 58 of block 44 and correspondingly with air pressure switch 54. Control valve 50, air pressure switch 54 and blower 55 are usual components readily available by any one skilled in the art and, therefore, are shown in block diagram form only. Likewise, lines 52 and 53 are connected to a usual source of AC or DC power, and line 51 is connected to a usual supply of water. Therefore, these features are not shown in further detail.

The functions and operations of the various mechanical, electrical and pneumatic components discussed above are best understood by describing below a usual glove testing procedure. At the start of a glove testing procedure, platform 3 will be in a raised position as shown in FIG. 1 and lever 39 will be pivoted in the direction of arrow A, FIG. 2 moving inner ring 16 to a raised position above annular recess 24 of outer ring 17. A glove 20 is mounted on assembly 5 by inserting bead 25 into annular recess 24 of outer ring 17. A glove 20 is mounted on assembly 5 by inserting bead 25 into annular recess 24 with cuff 26 being laid along annular cutout surface 32. Lever 39 is then moved upwardly which will slide inner ring outer surface 28 along outer ring inner surface 23 downwardly beyond recess 24 and cuff bead 25 to position shown in FIG. 2 to securely clamp glove cuff 26 between rings 16 and 17. When in this clamping position, ring surfaces 21 and 22 will lie in a generally horizontal plane which will coincide with surface 12a of fluid 12 in tank 4, as shown in FIG. 2.

After one or more gloves 20 are secured in a clamped position on assemblies 5 between rings 16 and 17, a control button (not shown) is actuated opening valve 50 permitting water to flow through conduit 51 and down through conduit 34 through hollow interior 59 of electrode 43 and into the interior of glove 20 as indicated by arrows B (FIG. 2). Simultaneously with the flow of water into the interior of glove 20, blower 55 is energized providing a flow of air through conduits 56 and 57 and along annular air passage 47 into the glove interior. This incoming air from blower 55 and the initial air present in the interior of glove 20 that is being expelled therefrom by the incoming water, is vented upwardly through perforated disc holes 38 as indicated by arrows C (FIG. 2). Once the water filling process is underway, the control mechanism of elevator 2 will lower platform 3 into conductive liquid 12 in tank 4. Appropriate controls such as a photoelectric eye detector or limit switch will stop the descent of platform 3 upon rings 16 and 17 reaching the position as shown in FIG. 2, in which position smooth curved bottom surfaces 21 and 22 will lie along surface 12a of conductive liquid 12.

Upon the water or other conductive liquid 60 within glove 20 reaching the open bottom of air sensing tube 46, a back pressure will be exerted on air pressure switch 54 due to the air passage being blocked by the water. This back pressure will be detected automatically by air pressure switch 54 which will deactuate blower 55 and control valve 50 stopping the further flow of water 60 into glove interior 20. The electrical signals sent through lines 52 and 53 to water valve 50 also may be sent to appropriate relays in switches which can be activated to impress the test voltage on tank 4 and electrode 43 in a usual manner. Again the particular electrical arrangement and circuitry for impressing the conductive test voltage on glove 20 is not shown since various types may be used all of which are well known in the art.

After completion of the electrical test on glove 20, platform 3 is raised to its upward position after which levers 39 can be individually actuated to disengage inner ring 16 from its clamping engagement against glove cuff 26 whereupon the glove can easily be removed and emptied of water 60 by a workman.

Improved test device 1 and in particular glove mounting and clamping assembly 5, as well as the water fill control assembly 6, provide a number of advantages not believed present in known glove testing equipment. The smooth curved surfaces 21 and 22 of rings 16 and 17 eliminate the corona and ozone effect produced at the surface level of the conductive liquid and enables essentially the whole glove to be tested since nearly all of the glove is immersed in the test liquid as can be seen in FIG. 2. Heretofore, the glove cuff had to be clamped above the water level reducing the area of glove that was contacted by the conductive fluids 12 and 60 and accordingly tested by the voltage applied thereto.

Another feature is that insulating sleeve 35 effectively covers most of the exposed metal of air sensing tube 46 and electrode 43 thereby increasing considerably the length of any arcing path which could occur during the test procedure, since the other system components such as brackets 14 and 15, rings 16 and 17, inner ring mounting disc 36 are all formed of a dielectric material without any metal parts thereon. Still another feature of the improved device 1 is the unique means of filling glove 20 with water or other conductive fluids 60 to the desired level by using electrode 43 as the filling tube and the cooperation of air sensing tube 46 with pressure actuated switch 54 and electric control valve 50. This arrangement ensures that the correct amount of fluid 60 is placed in glove 20 so that it aligns with bottom surface 21 of inner ring 16 to reduce the electrical stress at this area as heretofore occurred. Accordingly, the improved electrical glove testing device provides an effective, safe, inexpensive, and efficient device which achieves all the enumerated objectives, provides for eliminating difficulties encountered with prior devices, and solves problems and obtains new results in the art.

In the foregoing description, certain terms have been used for brevity, clearness and understanding; but no unnecessary limitations are to be implied therefrom beyond the requirements of the prior art, because such terms are used for descriptive purposes and are intended to be broadly construed.

Moreover, the description and illustration of the invention is by way of example, and the scope of the invention is not limited to the exact details shown or described.

Having now described the features, discoveries and principles of the invention, the manner in which the improved insulating glove electrical testing device is constructed and used, the characteristics of the construction, and the advantageous, new and useful results obtained; the new and useful structures, devices, elements, arrangements, parts, and combinations, are set forth in the appended claims.

What is claimed is:

1. An improved device for the electrical testing of insulating gloves including:
    (a) a platform;
    (b) tank means located beneath the platform for holding a supply of conductive liquid;
    (c) elevator means for raising and lowering the platform with respect to the tank means;
    (d) glove mounting means for releasably suspending a glove to be tested from the platform;
    (e) electrode means for insertion into the interior of a glove when suspended from the platform by the glove mounting means;
    (f) means for filling a suspended glove with a conductive liquid;
    (g) air sensing means for detecting when the glove has been filled with the conductive liquid to a predetermined level; and
    (h) control means communicating with the air sensing means for automatically stopping the flow of liquid into the glove upon the liquid in said glove reaching a predetermined level.

2. The testing device defined in claim 1 in which the air sensing means includes a tube telescopically mounted about and spaced from the electrode means forming an air passage therebetween, an air blower for supplying a flow of air through the air passage and into the interior of a glove being tested, and a pressure switch which communicates with the air passage for detecting pressure differential of the air flowing through said air passage upon the conductive liquid level reaching a predetermined height and restricting the flow of air through said passage.

3. The testing device defined in claim 2 in which the air pressure switch means is operatively connected to the control means for actuating the control means upon the liquid level reaching its predetermined height within the glove.

4. The testing device defined in claim 1 in which the electrode means is a hollow metal rod; and in which the glove liquid filling means includes a supply of water communicating with the hollow electrode rod and valve means for controlling the flow of water into the electrode rod.

5. The testing device defined in claim 1 in which the glove mounting means includes an outer fixed ring of insulating material suspended from beneath the platform and a movably mounted inner ring of insulating material; and in which said inner ring clamps the cuff of a glove against said outer ring to mount the glove thereon.

6. The testing device defined in claim 5 in which a sleeve of insulating material is telescopically mounted about the electrode means and connected to the inner clamping ring; and in which a lever is attached to the insulating sleeve for raising and lowering the inner ring to release and clamp a glove against the outer ring.

7. The testing device defined in claim 5 in which the inner and outer glove clamping rings are formed with curved lower surfaces to provide a gradual smooth curve at the point of contact between said rings and the surface of the conductive liquid in the tank means.

8. The testing device defined in claim 6 in which a perforated insulating disc connects the insulating sleeve to the inner clamping ring.

9. The testing device defined in claim 6 in which an annular groove is formed in an inner surface of the outer clamping ring for receiving the edge bead of the glove cuff therein.

10. The testing device defined in claim 6 in which the outer clamping ring is mounted by insulating brackets on the platform; and in which the inner ring actuated lever is pivotally mounted on one of the brackets.

11. The testing device defined in claim 1 in which a plurality of glove mounting means are mounted on the platform; and in which the control means for the liquid flow and for applying the electrical test potential are interconnected to simultaneously test said plurality of gloves.

12. An improved mounting device for supporting an insulating glove during electrical testing of the glove in a tank of conductive liquid, said mounting device including:
 (a) a platform adapted to be raised and lowered with respect to the tank of conductive liquid;
 (b) bracket means extending downward from the platform;
 (c) inner and outer rings of insulating material mounted on the bracket means, said rings having smooth gradually curved surfaces adapted to engage the surface of the conductive liquid in the tank to reduce the electric field stress on the glove during the electrical testing of said glove;
 (d) means for mounting the inner ring on the bracket means for movement into and out of engagement with the outer ring for clamping the cuff of a glove therebetween;
 (e) electrode means for insertion into the interior of a glove when clamped between the inner and outer rings; and
 (f) means for filling a glove clamped between the rings with a conductive liquid.

13. The mounting device defined in claim 12 in which the electrode means is a hollow tube adapted to be connected to a source of water for filling the glove with water, air sensing means for detecting when the glove is filled with water, and control means communicating with the air sensing means for automatically stopping the flow of water into the glove upon the water reaching the curved surfaces of the glove clamping rings.

14. The mounting device defined in claim 13 in which the air sensing means includes an air supply tube telescopically mounted about the electrode means tube and forming an air passage therebetween; and in which a supply of air communicates with the air passage for flowing into the glove interior.

15. The mounting device defined in claim 14 in which the inner ring is mounted on a sleeve which is telescopically mounted about the electrode means tube and air supply tube; and in which the sleeve is connected to the inner ring by a perforated member, said perforated member providing escape vents for the air flowing into the glove from the air supply tube.

16. The mounting device defined in claim 12 in which the inner and outer rings have smooth tapered mating surfaces for clamping the cuff of a glove therebetween.

* * * * *